(12) United States Patent
Lewin et al.

(10) Patent No.: US 7,709,759 B2
(45) Date of Patent: May 4, 2010

(54) CONTACT ELEMENT AND A CONTACT ARRANGEMENT

(75) Inventors: Erik Lewin, Uppsala (SE); Ulf Jansson, Uppsala (SE); Ola Wilhelmsson, Gävle (SE)

(73) Assignees: ABB Research Ltd., Zürich (CH); Impact Coatings AB, Linköping (SE)

( * ) Notice: Subject to any disclaimer, the term of this patent is extended or adjusted under 35 U.S.C. 154(b) by 0 days.

(21) Appl. No.: 11/988,793

(22) PCT Filed: Jun. 22, 2006

(86) PCT No.: PCT/SE2006/000769

§ 371 (c)(1),
(2), (4) Date: Feb. 17, 2009

(87) PCT Pub. No.: WO2007/011276

PCT Pub. Date: Jan. 25, 2007

(65) Prior Publication Data

US 2009/0178905 A1   Jul. 16, 2009

Related U.S. Application Data

(60) Provisional application No. 60/796,521, filed on May 2, 2006.

(30) Foreign Application Priority Data

Jul. 15, 2005   (SE) .................................... 0501667

(51) Int. Cl.
*H01H 1/02* (2006.01)

(52) U.S. Cl. ........................................ 200/270; 439/886
(58) Field of Classification Search ................. 439/886, 439/887; 200/265–270
See application file for complete search history.

(56) References Cited

U.S. PATENT DOCUMENTS

| 4,680,438 | A | * | 7/1987 | Witting et al. ............... 200/268 |
| 5,030,494 | A | * | 7/1991 | Ahlert et al. ............. 428/848.1 |
| 5,316,507 | A | * | 5/1994 | Capp ........................... 439/886 |
| 5,351,396 | A | * | 10/1994 | Sawada et al. ................ 29/885 |
| 5,597,064 | A | * | 1/1997 | Ozaki et al. .................. 200/269 |

(Continued)

FOREIGN PATENT DOCUMENTS

DE            3347550 A1        7/1985

(Continued)

OTHER PUBLICATIONS

PCT/ISA/210—International Search Report—Nov. 7, 2006.

(Continued)

*Primary Examiner*—Ross N Gushi
(74) *Attorney, Agent, or Firm*—Venable LLP; Eric J. Franklin

(57) ABSTRACT

A contact element for making an electric contact to a contact member for enabling an electric current to flow between the contact element and the contact member includes a body having at least one contact surface thereof coated with a contact layer to be applied against the contact member. The contact layer includes a nanocomposite film having a matrix of amorphous carbon and crystallites of nano-size, i.e. with dimensions in the range of 1-100 nm, of at least one metal carbide embedded therein.

25 Claims, 3 Drawing Sheets

U.S. PATENT DOCUMENTS

| | | | |
|---|---|---|---|
| 5,610,347 A * | 3/1997 | Behrens et al. | 75/247 |
| 6,246,020 B1 * | 6/2001 | Sato | 200/263 |
| 6,350,294 B1 | 2/2002 | Renner et al. | |
| 6,360,437 B1 * | 3/2002 | Fukumoto et al. | 29/874 |
| 6,747,291 B1 * | 6/2004 | Lu et al. | 257/77 |
| 6,815,323 B1 * | 11/2004 | Lu et al. | 438/602 |
| 6,821,624 B2 * | 11/2004 | Utsumi et al. | 428/408 |
| 6,838,627 B1 * | 1/2005 | Isberg et al. | 200/262 |
| 7,564,330 B2 * | 7/2009 | Pickhard et al. | 335/151 |
| 2001/0024737 A1 * | 9/2001 | Utsumi et al. | 428/651 |
| 2002/0068488 A1 * | 6/2002 | Tuller et al. | 439/775 |
| 2003/0087096 A1 * | 5/2003 | Sato et al. | 428/408 |
| 2004/0202884 A1 * | 10/2004 | Buresch et al. | 428/556 |
| 2006/0040105 A1 * | 2/2006 | Sato et al. | 428/408 |
| 2006/0094309 A1 * | 5/2006 | Holtkamp et al. | 439/886 |
| 2006/0134424 A1 * | 6/2006 | Plissonnier | 428/408 |
| 2007/0111031 A1 * | 5/2007 | Isberg et al. | 428/698 |
| 2009/0001669 A1 * | 1/2009 | Hoppe et al. | 277/442 |
| 2009/0178905 A1 * | 7/2009 | Lewin et al. | 200/270 |
| 2009/0263647 A1 * | 10/2009 | Gangopadhyay et al. | 428/335 |

FOREIGN PATENT DOCUMENTS

| | | |
|---|---|---|
| EP | 0863521 A2 | 9/1998 |
| EP | 1383168 A1 | 1/2004 |
| WO | WO-01/41167 A2 | 6/2001 |

OTHER PUBLICATIONS

PCT/ISA/237—Written Opinion of the International Searching Authority—Nov. 7, 2006.

* cited by examiner

CONTACT ELEMENT AND A CONTACT ARRANGEMENT

CROSS-REFERENCE TO RELATED APPLICATIONS

This application claims priority to U.S. provisional patent application 60/796,521 filed 2 May 2006 and Swedish patent application 0501667-0 filed 12 Jul. 2005 and is the national phase under 35 U.S.C. §371 of PCT/SE2006/000769.

TECHNICAL FIELD OF THE INVENTION AND PRIOR ART

The present invention relates to a contact element for making an electric contact to a contact member for enabling an electric current to flow between said contact element and said contact member, said contact element comprising a body having at least one contact surface thereof coated with a contact layer to be applied against said contact member, as well as a sliding electric contact arrangement, i.e. a contact arrangement in which two contact surfaces adapted to be applied against each other for establishing an electric contact may slide with respect to each other when establishing and/or interrupting and/or maintaining the contact action.

Such a contact element may have many different applications, in which said contact layer is arranged for establishing an electric contact to a contact member with desired properties, such as a low contact resistance, a high resistance to wear and a low friction coefficient with respect to the material of the contact member to be contacted etc. Such applications are for instance for making contacts for semiconductor devices in a wafer of one or more such devices, for establishing and interrupting an electric contact in mechanical disconnectors and breakers and for establishing and interrupting electric contacts in contact arrangements of plug-in type. Such electric contact elements, which may establish sliding contacts or stationary contacts, have preferably a body made of for instance copper or aluminium. It is known to coat said body with a contact layer of metal for protecting contact surfaces of the contact element against wear and corrosion. However, it has turned out that the metals used until now for such a contact layer have shown a tendency to get stuck to the surface on the contact member bearing thereagainst, which may result in damaging the surface near portions of the contact element and/or contact member, when traction forces attempt to move the contact element with respect to the contact member, for instance as a consequence of a difference in coefficient of thermal expansion of the material of the contact element and that of the contact member upon temperature changes or when the contact element and the contact member are to be moved with respect to each other in a sliding contact. This problem has been solved by lubricating the contact surfaces of the contact element and the contact member with a lubricant. Such a lubricant may have an oil or a fat as base, but solid lubricants, such as graphite, also exist. However, solid lubricants have a poor electric conductivity and are often worn away when the contact surfaces are sliding against each other.

WO 01/41167 discloses a solution to these problems by designing said contact layer as a continuous film comprising a laminated multi element material.

However, there is a constant desire and need of said contact elements being improved with respect to contact elements known in several aspects, such as having a lower contact resistance, a higher resistance to wear and thereby an increased life span as well as even lower friction for reducing the need of lubrification.

SUMMARY OF THE INVENTION

The object of the present invention is to provide an electric contact element being improved with respect to contact elements already known by at least partially addressing said need.

This object is according to the invention obtained by providing a contact element of the type defined in the introduction, in which said contact layer comprises a nanocomposite film having a matrix of amorphous carbon and crystallites of nano-size, i.e. with dimensions in the range of 1-100 nm, of at least one metal carbide embedded therein.

It has turned out that such a nanocomposite film has properties making it excellently suited to be used as such a contact layer. This is due to the nature of the matrix of amorphous carbon allowing a physical adaption of the interface surface of the contact layer to a corresponding or other contact layer on said contact member combined with the metal carbide crystallites embedded therein reducing the resistivity of the contact layer with respect to the layer being only of amorphous carbon. Furthermore, the presence of the metal carbide in said matrix or binding phase of amorphous carbon increases the wear resistance of the contact layer. Such a nanocomposite film has also the potential for a low friction coefficient with respect to a said contact member.

"Matrix" is in this disclosure to be interpreted to not only relate to a continuous majority phase in which particles of carbide are contained. The carbon matrix may also be a minority phase and not even continuous, and this matrix may in the extreme case only consist of a few atomic layers around the carbide grains. Thus, the matrix is to be interpreted as this type of binding phase.

The different properties of the matrix of amorphous carbon and the nano-size crystallites of metal carbide makes it of course possible to optimize the contact layer for each intended use of the contact element by changing primarily the metal carbide/carbon matrix ratio. The hardness of the contact layer will increase with an increasing such ratio, while the resistivity thereof will decrease with an increasing metal carbide/carbon matrix ratio. However, the contact resistance will change with an increasing such ratio.

According to an embodiment of the invention said metal is a transition metal, i.e. an element from Group 3 to 12 of the periodic table. It has been found that such a metal gives the contact layer excellent properties especially with respect to a low contact resistance. As an example of metals well suited for said nano-size metal carbides niobium and titanium may be mentioned.

According to another embodiment of the invention said film only comprises one metal, i.e. there is a binary system. It has turned out that it is mostly sufficient to have only one metal forming a metal carbide embedded in said matrix of amorphous carbon for obtaining the properties of the contact layer aimed at.

According to another embodiment of the invention said film comprises crystallites of nano-size of a carbide of at least one further, second metal. This metal may advantageously be a transition metal. It has been found that the addition of such a second metal improves the possibilities to adapt the properties of the contact layer to the demands put on the contact element in the intended use. Sometimes a very low contact resistance is more important than a high resistance to wear or conversely, and this may then be addressed by adding such a second metal. The so-called metal carbide properties of the nanocomposite film may be improved through the addition of this further carbide forming metal.

According to another embodiment of the invention said crystallites have a diameter-like dimension in the range of 5-50 nm. It has turned out that this size of the crystallites results in particularly advantageous characteristics often asked for in a contact layer of this type.

According to another embodiment of the invention said matrix further comprises a further, third metal arranged in a phase embedded in carbon of said matrix and separated with respect to carbon of said matrix. The addition of such a metal not forming a metal carbide will primarily change the properties of said matrix and may reduce the resistivity thereof and thereby of the entire contact layer.

Said further, third metal is advantageously a transition metal and may for example be Ag.

According to another embodiment of the invention said carbide crystallites contain a solid solution of a weak or non-carbide forming metal. "Weak" means that the metal has a low inclination to form a carbide. The addition of such a metal to the carbide crystallites causes a lowering of the carbon-content of the carbide phase and hence an increase in the amount of carbon in the matrix phase. This is due to the fact that this metal will bind the metal of said at least one metal carbide, so that that metal will not be able to bind as much carbon as otherwise forcing carbon out into the matrix phase and increasing the amount of carbon therein. This will influence the mechanical and electrical properties in a way which may be of importance for contact applications. Said weak or non-carbide forming metal is a transition metal from Group 7 to 12 of the periodic table or Al, or combinations thereof. Especially Al may be used to bind Titanium.

According to another embodiment of the invention said matrix of amorphous carbon has a high ratio of sp2/sp3 bonds between carbon atoms of said matrix of amorphous carbon, said ratio being higher than 0.6. The so-called hybridisation of the amorphous carbon matrix characterized by a high such ratio makes the matrix more graphite-like than diamond-like, which results in a higher electric conductivity than would the relationship be the opposite. The matrix will at the same time be softer which improves the adaptivity of the surface of the contact layer to the surface of the contact member when pressing them against each other.

According to another embodiment of the invention the thickness of said film is in the range of 0.05-10 μm, which is suitable for most applications.

According to another embodiment of the invention said film is deposited on said body by the use of a vapour deposition technique, which may be Physical Vapour Deposition (PVD) or Chemical Vapour Deposition (CVD). The film may also be formed on said body by the use of a solution method, such as sol-gel.

Another object of the present invention is to provide a sliding electric contact arrangement of the type defined in the introduction allowing a movement of two contact surfaces applied against each other while reducing the inconveniences discussed above to a large extent.

This object is according to the invention obtained by providing such an arrangement with a contact element according to the present invention arranged to form a dry contact with a low friction coefficient, below 0.3, preferably below 0.2, to a contact member.

The basic features and advantages of such a contact arrangement are associated with the characteristics of the contact element according to the present invention and appear from the discussion above, of such a contact element. However, it is pointed out that "sliding electric contact" includes all types of arrangements making an electric contact between two members, which may move with respect to each other when the contact is established and/or interrupted and/or when the contact action is maintained. Accordingly, it includes not only contacts sliding along each other by action of an actuating member, but also so-called stationary contacts having two contact elements pressed against each other and moving with respect to each other in the contacting state as a consequence of magneto-striction, thermal cycling and materials of the contact elements with different coefficients of thermal expansion or temperature differences between different parts of the contact elements varying over the time.

According to an embodiment of the present invention the contact element and the contact member are adapted to be pressed towards each other for establishing said contact, and the arrangement may comprise means for spring-loading the contact element and the contact member against each other for making said electric contact.

Further advantages as well as advantageous features of the invention appear from the following description and the other dependent claims.

BRIEF DESCRIPTION OF THE DRAWINGS

With reference to that appended drawings, below follows a specific description of embodiments of the invention cited as examples.

In the drawings.

DETAILED DESCRIPTION OF PREFERRED EMBODIMENTS OF THE INVENTION

Figure 1:
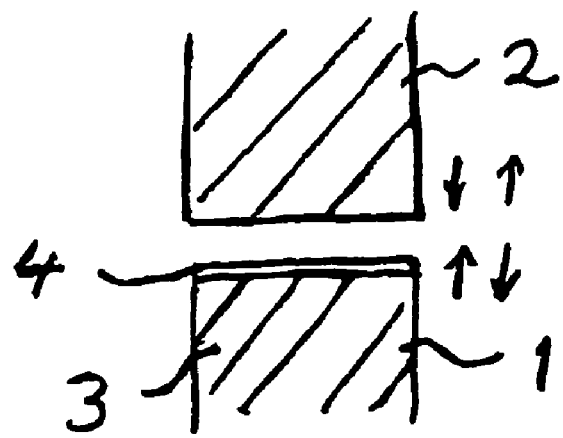
FIG. 1 illustrates very schematically an electric contact element according to an embodiment of the invention.

A contact element 1 forming an electric contact to a contact member 2 for enabling an electric current to flow between said contact element and said contact member is very schematically shown in FIG. 1. The contact element comprises a body 3, which may be for instance of aluminium or copper, and has at least one contact surface thereof coated with a contact layer 4 to be applied against said contact member. The contact layer 4 has typically a thickness of 0.05-10 μm, so that the thickness shown in FIG. 1 is exaggerated with respect to other dimensions of the contact element and the contact member for illustrating purposes.

The contact layer 4 comprises a nanocomposite film having a matrix of amorphous carbon and crystallites of nano-size, i.e. with dimensions in the range of 1-100 nm, of at least one metal carbide embedded therein. This gives the contact layer the excellent properties reported above. The metal is preferably a transition metal. The hybridization of the amorphous carbon matrix, i.e. how the carbon is bound to itself within the matrix, is preferably characterized by a high sp2/sp3 ratio, which makes the matrix more graphite-like than diamond-like. A third component may be added to the nanocomposite for changing the properties thereof. This can be another metal to improve the metal carbide properties by forming another metal carbide embedded in the matrix or another metal changing the composite properties by being arranged in a phase embedded in carbon of the matrix and separated with respect to carbon of the matrix. Depending on the application of the contact element the properties of the total contact structure can be optimized by:
1) changing the amorphous carbon matrix/metal carbide ratio with the results discussed above
2) changing the grain size of the metal carbide crystallites for changing the bulk resistivity of the contact layer, which in most cases will be reduced when the grain size is increased
3) changing the sp2/sp3 ratio of the amorphous carbon matrix with the above result
4) adding a second carbide-forming or non-carbide-forming metal, such as Ag, with the above result.

A contact layer having the following advantages may thus be obtained:
a) a low contact resistance over a broad range of contact loads (forces)
b) high resistance to wear
c) low friction
d) high corrosion resistance
e) good high-temperature properties,
f) a large potential to various properties by tuning as described above.

Figure 2:
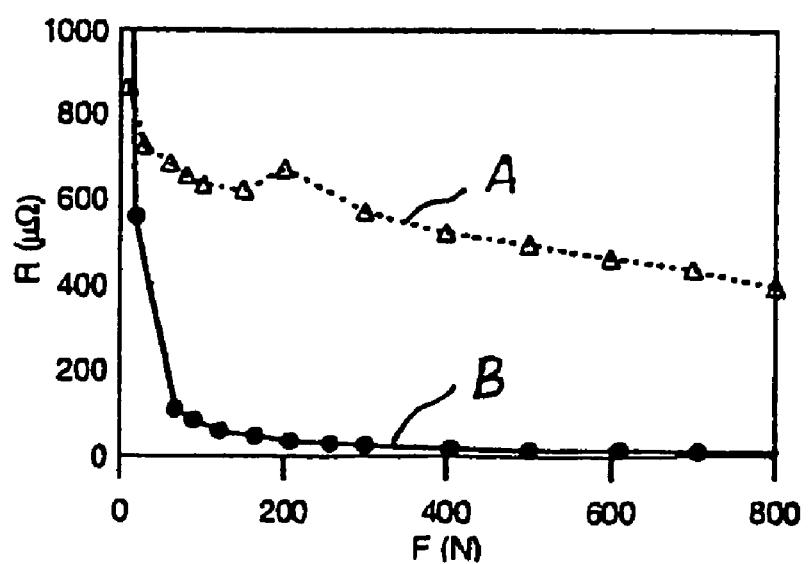
FIG. 2 shows the contact resistance versus contact force for a traditional contact and one according to the invention.

The advantage a) is illustrated in FIG. 2, in which the contact resistance versus contact force is shown for a traditional contact represented by a Ni-plated washer according to A and a nanocomposite film of an amorphous carbon matrix with nanocrystalline NbC embedded therein according to B. Both coatings were measured against Ag. It clearly appears that the contact layer in accordance with the invention has a remarkably reduced contact resistance over a broad range of contact loads with respect to the traditional contact. It is particularly interesting that the contact resistance is much lower already at low loads.

By way of example it may be mentioned that possible nanocomposite films in contact elements according to the invention may be nanocomposite Ti—C thin films with a composition varying between 14 and 57 atom % Ti and a thickness of about 0.2 μm. These films have TiC-crystallites embedded in an amorphous carbon-phase. The relationship between these two phases varies between 45 and 95 atom % amorphous C-C-phase. In a specific embodiment the nanocomposite film has a thickness of 0.2 μm and a total composition of 53 atom % Ti and 47 atom % C. This film has an amorphous carbon matrix (where about 56 atom % of the carbon is bonded) and TiC-crystallites (where about 44% of the carbon is bonded). Crystallites are in average 13 nm in diameter.

Figure 3:
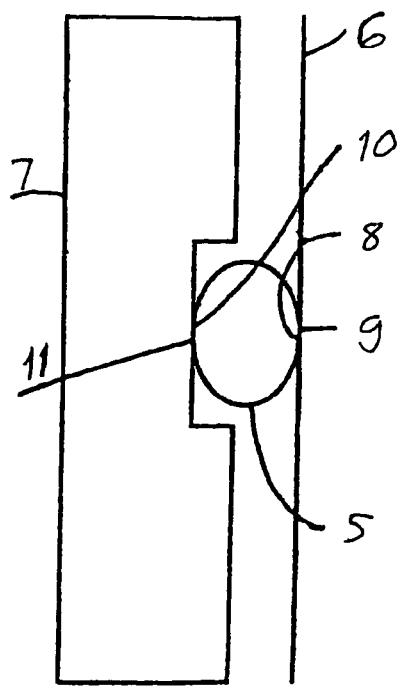
FIG. 3 is a sectioned view of an electric contact element of helical contact type according to another embodiment of the invention.

FIG. 3 illustrates an example of a contact arrangement in which it is advantageous to coat at least one of the contact surfaces with the contact layer according to the invention for forming a self-lubricating dry contact with a very low friction. This embodiment relates to a helical contact arrangement having a contact element 5 in the form of a spring-loaded annular body, such as a ring of a helically wound wire, adapted to establish and maintain an electric contact to a first contact member 6, such as an inner sleeve or a pin, and a second contact member 7, such as an outer sleeve or tube. The contact element 5 is in a contact state compressed so that at least a contact surface 8 thereof will bear spring-loadedly against the contact surface 9 of the first contact member 6 and at least another contact surface 10 of the first contact element 5 will bear spring-loadedly against at least a contact surface 11 of the second contact member 7. According to this embodiment of the invention at least one of the contact surfaces 8-11 is entirely or partially coated with a contact layer comprising a nanocomposite film according to the invention. Such a helical contact arrangement is used for example in an electrical breaker in a switch gear.

Figure 4:
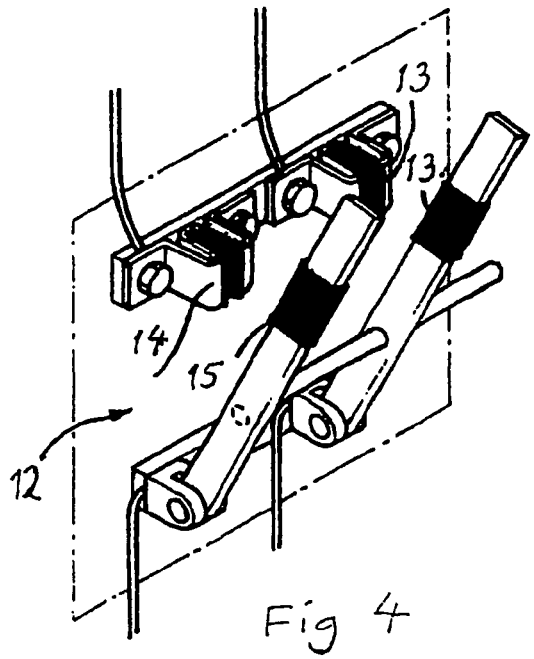
FIG. 4 illustrates very schematically a contact arrangement according to the present invention in a disconnector.

FIG. 4 illustrates very schematically how an electric contact arrangement according to the invention may be arranged in a disconnector 12 with a low friction film 13 in the form of a nanocomposite film having a matrix of amorphous carbon and nano-size crystallites of a metal carbide embedded therein on at least one of the contact surfaces of two contact elements 14, 15 movable with respect to each other for establishing an electric contact therebetween and obtaining a visible disconnection of the contact elements.

Figure 5:
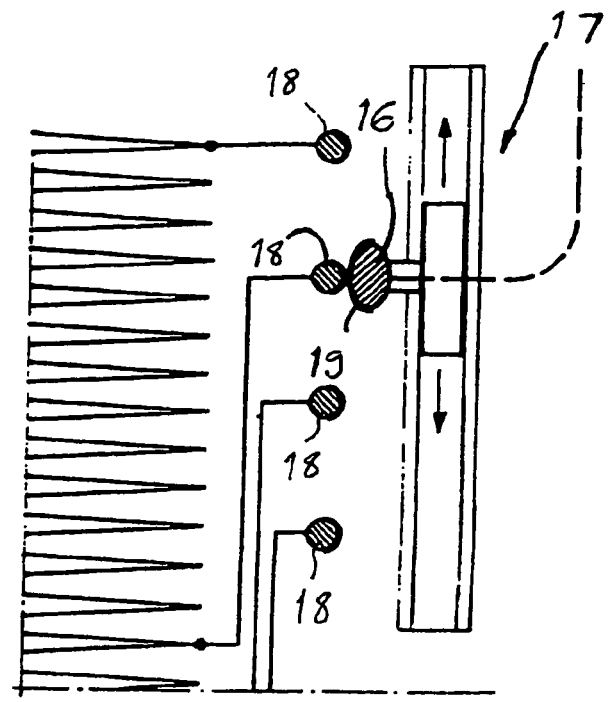
FIG. 5 illustrates very schematically a sliding contact arrangement in a tap changer of a transformer according to an embodiment of the invention.

FIG. 5 illustrates schematically a sliding electric contact arrangement according to another embodiment of the invention, in which the contact element 16 is a movable part of a tap changer 17 of a transformer adapted to slide in electric contact along contacts 18 to the secondary winding of the transformer, accordingly forming the contact member, for tapping voltage of a level desired from said transformer. A low friction film 19 comprising an amorphous carbon matrix with nanocrystallites of a metal carbide is arranged on the contact surface of the contact element 16 and/or on the contact member 18. The contact element 16 may in this way be easily moved along the winding while maintaining a low resistance contact thereto.

Figure 6:
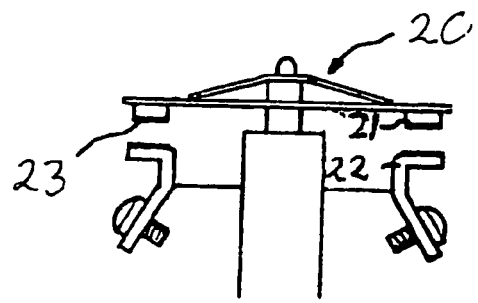
FIG. 6 illustrates very schematically a contact arrangement according to the present invention in a relay.

Finally, FIG. 6 illustrates very schematically a contact arrangement according to another embodiment of the invention used in a relay 20, and one or both of the contact surfaces of opposite contact elements 21, 22 may be provided with a low friction film 23 according to the invention, which will result in less wear of the contact surface and make them corrosion resistant as a consequence of the character of said contact layer material.

Figure 7:
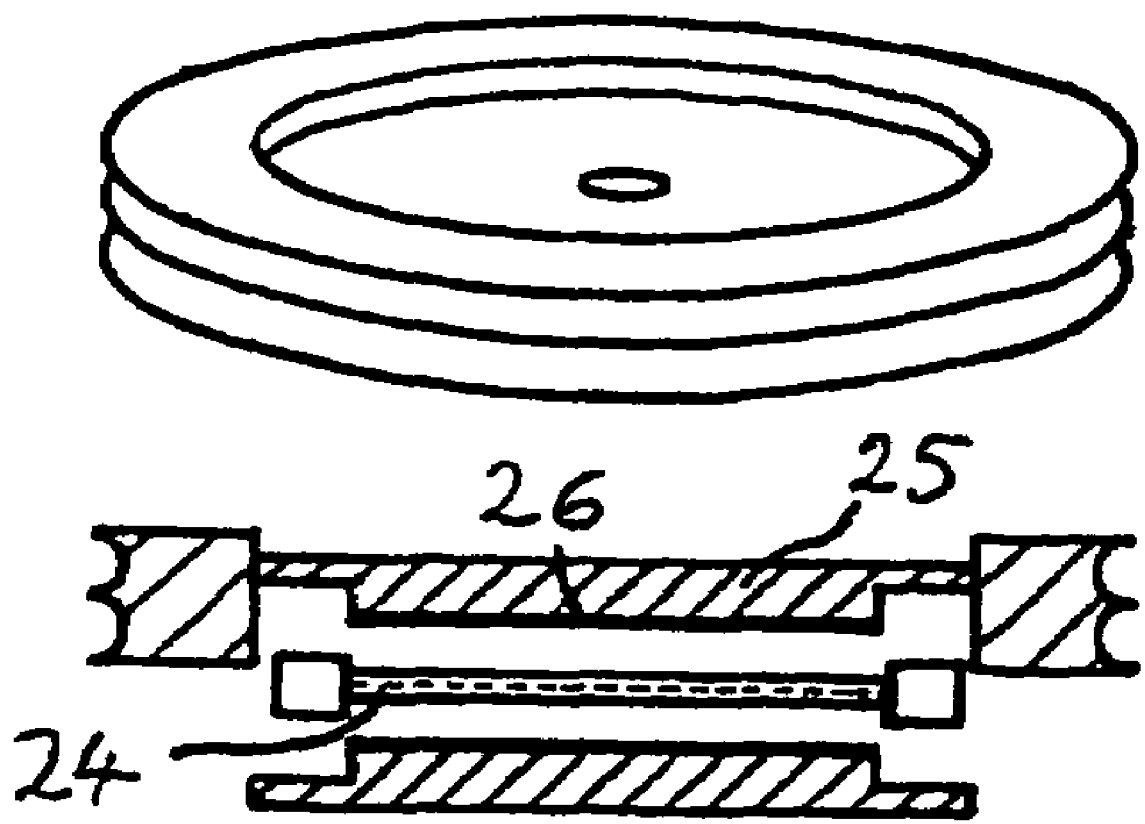
FIG. 7 is a partially sectioned and exploded view of an arrangement for making an electric contact to a semiconductor chip according to another embodiment of the invention.

An arrangement for making good electric contact to a semiconductor component 24 is illustrated in FIG. 7, but the different members arranged in a stack and pressed together with a high pressure, preferably exceeding 1 MPa and typically 6-8 MPa, are shown spaced apart for clarity. Each half of the stack comprises a pool piece 25 in the form of a Cu plate for making a connection to the semiconductor component. Each pool piece is provided with a thin nanocomposite film 26. The coefficient of thermal expansion of the semiconductor material, for instance Si, SiC or diamond, of the semiconductor component and of Cu differs a lot ($2.2 \times 10^6$/K for Si and $16 \times 10^{-6}$/K for Cu), which means that the Cu plates 25 and the semiconductor component 24 will move laterally with respect to each other when the temperature thereof changes. The low friction of a film according to the present invention makes it possible to omit further members in said stack between the pool piece and the semiconductor component for taking care of the tendency to mutual movements upon thermal cycling for avoiding cracks in the semiconductor component and/or wear of the contact surface of said component.

A contact element and a sliding electric contact arrangement according to the present invention may find many other preferred applications, and such applications would be apparent to a person with ordinary skill in the art without departing from the basic idea of the invention as defined in the appended claims.

It is also pointed out that other transition metals than those mentioned above may be suited to form said metal carbide crystallites of nano-size for meeting different demands put on the contact layer in different applications.

The invention claimed is:

1. A contact element for making an electric contact to a contact member for enabling an electric current to flow between said contact element and said contact member, said contact element comprising
a body having at least one contact surface thereof coated with a contact layer to be applied against said contact member, wherein said contact layer comprises a nanocomposite film having a matrix of amorphous carbon and crystallites of nano-size having dimensions in the range of 1-100 nm of at least one metal carbide embedded therein.

2. The contact element according to claim 1, wherein said film only comprises one metal.

3. The contact element according to claim 1, wherein said crystallites have a diameter-like dimension in the range of 5-50 nm.

4. The contact element according to claim 1, wherein said matrix of amorphous carbon has a high ratio of sp2/sp3-bonds between carbon atoms of said matrix of amorphous carbon, said ratio being higher than 0.6.

5. The contact element according to claim 1, wherein a thickness of said film is in the range of 0.05-10 μm.

6. The contact element according to claim 1, wherein said film is formed on said body by a solution method.

7. The contact element according to claim 1, wherein said metal is a transition metal from Group 3 to 12 of the periodic table.

8. The contact element according to claim 7, wherein said metal is Niobium or Titanium.

9. The contact element according to claim 1, wherein said film comprises crystallites of nano-size of a carbide of at least one further, second metal.

10. The contact element according to claim 9, wherein said second metal is a transition metal.

11. The contact element according to claim 9, wherein said matrix further comprises a further, third metal arranged in a phase embedded in carbon of said matrix and separated with respect to carbon of said matrix.

12. The contact element according to claim 11, wherein said further, third metal is a transition metal.

13. The contact element according to claim 12, wherein said further, third metal is Ag.

14. The contact element according to claim 1, wherein said carbide crystallites comprise a solid solution of a weak or non-carbide forming metal.

15. The contact element according to claim 14, wherein said weak or non-carbide forming metal is a transition metal from Group 7 to 12 of the periodic table or Al, or combinations thereof.

16. The contact element according to claim 1, wherein said film is deposited on said body by the use of a vapour deposition technique.

17. The contact element according to claim 16, wherein said film is deposited on said body by physical vapor deposition or chemical vapor deposition.

18. A sliding electric contact arrangement in which two contact surfaces adapted to be applied against each other for establishing an electric contact may slide with respect to each other when establishing and/or interrupting and/or maintaining the contact action, comprising:
a contact element comprising a body having at least one contact surface thereof coated with a contact layer to be applied against said contact member, wherein said contact layer comprises a nanocomposite film having a matrix of amorphous carbon and crystallites of nano-size having dimensions in the range of 1-100 nm of at least one metal carbide embedded therein, wherein said film is arranged to form a dry contact with a low friction coefficient below 0.3 to a contact member.

19. The arrangement according to claim 18, wherein said friction coefficient is below 0.2.

20. The arrangement according to claim 18, wherein the surfaces of the contact element and the contact member adapted to be applied against each other for establishing said electric contact are allowed to move with respect to each other as a consequence of different coefficients of thermal expansion of the materials of surface portions of the contact element and the contact member upon temperature changes of the contact element and the contact member.

21. The arrangement according to claim 20, wherein the contact element and the contact member are adapted to be pressed towards each other for establishing said contact.

22. The arrangement according to claim 18, further comprising:
means for spring-loading the contact element and the contact member against each other for making said electric contact.

23. The arrangement according to claim 18, wherein the arrangement is adapted to establish an electric contact in a tap changer for a transformer for making a contact to different winding turns of the transformer.

24. The arrangement according to claim 18, wherein the contact element and the contact member belong to two parts of a mechanical disconnector movable away from each other for disconnecting two terminals thereof.

25. The arrangement according to claim 18, wherein said contact element and said contact member belong to parts movable with respect to each other in a relay for establishing an electric contact therebetween when the relay operates.

* * * * *